(12) United States Patent
Yoshinaga et al.

(10) Patent No.: US 11,419,208 B2
(45) Date of Patent: Aug. 16, 2022

(54) ELECTRONIC CIRCUIT BOARD AND ELECTRONIC CIRCUIT DEVICE

(71) Applicant: HITACHI AUTOMOTIVE SYSTEMS, LTD., Hitachinaka (JP)

(72) Inventors: Kumiko Yoshinaga, Hitachinaka (JP); Eiji Ichikawa, Hitachinaka (JP); Hirofumi Watanabe, Hitachinaka (JP); Mototaka Takahashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 16/957,895

(22) PCT Filed: Dec. 28, 2018

(86) PCT No.: PCT/JP2018/048412
§ 371 (c)(1),
(2) Date: Jun. 25, 2020

(87) PCT Pub. No.: WO2019/131990
PCT Pub. Date: Jul. 4, 2019

(65) Prior Publication Data
US 2021/0227687 A1 Jul. 22, 2021

(30) Foreign Application Priority Data
Dec. 28, 2017 (JP) .............................. JP2017-253047

(51) Int. Cl.
*H05K 1/02* (2006.01)
*H02K 11/33* (2016.01)
(Continued)

(52) U.S. Cl.
CPC ........... *H05K 1/0281* (2013.01); *H02K 11/33* (2016.01); *H05K 1/0278* (2013.01);
(Continued)

(58) Field of Classification Search
CPC .. H05K 1/0281; H05K 1/0278; H05K 7/1427; H05K 2201/09781;
(Continued)

(56) References Cited

U.S. PATENT DOCUMENTS 4,812,135 A * 3/1989 Smith .................. H01B 7/0838
174/117 F
4,832,621 A 5/1989 Asai et al.
(Continued)

FOREIGN PATENT DOCUMENTS

JP H3-56166 U 5/1991
JP 2007-273981 A 10/2007
(Continued)

OTHER PUBLICATIONS

U.S. Appl. No. 16/957,882, filed Jun. 25, 2020, Hitachi Automotive Systems Ltd.
(Continued)

*Primary Examiner* — Steven T Sawyer
(74) *Attorney, Agent, or Firm* — Foley & Lardner LLP

(57) ABSTRACT

A circuit board (3) is provided with a first rigid part (11) having a power system electronic component mounted thereon, a second rigid part (12) having a control system electronic component mounted thereon, and a thin flexible part (13) connecting the first and second rigid parts to each other. The flexible part (13) is provided with a plurality of conductive wires (27) conducted with the electronic components of the first and second rigid parts (11, 12). A non-conductive metal pattern (33) that is a dummy pattern is formed along an outer edge (13a) of the flexible part (13). By the non-conductive metal pattern (33), the disconnection of the conductive wires (27) due to cracking is suppressed.

7 Claims, 6 Drawing Sheets

(51) Int. Cl.
*H05K 7/14* (2006.01)
*B62D 5/04* (2006.01)
*H05K 1/18* (2006.01)
*H05K 5/00* (2006.01)

(52) U.S. Cl.
CPC ......... *H05K 7/1427* (2013.01); *B62D 5/0463* (2013.01); *H05K 1/181* (2013.01); *H05K 5/0047* (2013.01); *H05K 2201/055* (2013.01); *H05K 2201/09027* (2013.01); *H05K 2201/09063* (2013.01); *H05K 2201/09163* (2013.01); *H05K 2201/09727* (2013.01); *H05K 2201/09781* (2013.01)

(58) Field of Classification Search
CPC .......... H05K 2201/09027; H05K 2201/09727; H05K 2201/09063; H05K 2201/055; H05K 5/0047; H05K 1/181; H05K 2201/09163; H05K 2201/2009; H05K 1/028; H05K 1/118; H05K 1/147; H05K 1/148; H05K 1/189; H05K 2201/042; H05K 2201/05; H05K 2201/058; H02K 11/33; B62D 5/0463
See application file for complete search history.

(56) References Cited

U.S. PATENT DOCUMENTS

| | | | | |
|---|---|---|---|---|
| 5,224,023 | A * | 6/1993 | Smith | G06F 1/184 174/254 |
| 2007/0227768 | A1 | 10/2007 | Shin | |
| 2008/0285241 | A1 * | 11/2008 | Hou | H05K 1/0281 361/749 |
| 2008/0289859 | A1 * | 11/2008 | Mikado | H05K 1/0281 174/254 |
| 2009/0231816 | A1 | 9/2009 | Lin | |
| 2015/0373830 | A1 * | 12/2015 | Miyagawa | H05K 1/028 174/520 |
| 2016/0065037 | A1 * | 3/2016 | Buerger | F04D 13/0606 310/52 |
| 2017/0217481 | A1 | 8/2017 | Asao | |

FOREIGN PATENT DOCUMENTS

| | | |
|---|---|---|
| JP | 2010-195219 A | 9/2010 |
| JP | 2014-060903 A | 4/2014 |
| JP | 2016-512948 A | 5/2016 |
| JP | 2010-105640 A | 5/2020 |
| WO | WO-2016/063367 A1 | 4/2016 |

OTHER PUBLICATIONS

International Search Report issued in corresponding application No. PCT/JP2018/048412 dated Mar. 19, 2019 with English translation.
Written Opinion issued in corresponding application No. PCT/JP2018/048412 dated Mar. 19, 2019 with English translation.
International Search Report issued in corresponding application No. PCT/JP2018/048413 dated Mar. 19, 2019 with English translation.
Written Opinion issued in corresponding application No. PCT/JP2018/048413 dated Mar. 19, 2019 with English translation.
Notice of Reasons for Refusal dated Jun. 15, 2021 issued in JP Application No. 2017-253047, with English translation, 11 pages.
Decision of Dismissal of Amendment dated Feb. 1, 2022 issued in JP Application No. 2017-253047, with English translation, 9 pages.
Decision of Refusal dated Feb. 1, 2022 issued in JP Application No. 2017-253047, with English translation, 2 pages.
Notice of Allowance on U.S. Appl. No. 16/957,882 dated May 12, 2022.

* cited by examiner

ELECTRONIC CIRCUIT BOARD AND ELECTRONIC CIRCUIT DEVICE

TECHNICAL FIELD

The present invention relates to an electronic circuit board on which electronic components are mounted and an electronic circuit device using the same, and particularly to an electronic circuit board provided with a flexible part between component mounting parts so as to be mounted on an apparatus in a state of being bent.

BACKGROUND TECHNOLOGY

In a patent document 1, as a circuit board incorporated into a motor unit of a power steering apparatus, a multilayer circuit board is disclosed which is formed so as to be used in a bent form having a substantially U-shape by connecting a plurality of rigid parts with flexible parts which are thinner than the rigid parts.

However, in the circuit board provided with such flexible parts, cracks of a base material at the flexible parts tend to occur, and there is concern about the disconnection of conductive wires provided to the flexible parts so as to electrically connect between the rigid parts.

PRIOR ART REFERENCE

Patent Document

Patent Document 1: Japanese Patent Application Publication 2014-60903

SUMMARY OF THE INVENTION

According to the present invention, in one aspect thereof, an electronic circuit board includes at least two component mounting parts and a flexible part located between the two component mounting parts adjacent to each other, and further includes a non-conductive metal pattern provided at a position closer to an outer edge of the flexible part than the non-conductive wire, in the flexible part.

According to the present invention, the occurrence of cracks or the increase of cracks at the flexible part is suppressed by the non-conductive metal patterns, and thereby the disconnection of the conductive wire located more on the inner side than the non-conductive metal patterns is suppressed.

MODE FOR IMPLEMENTING THE INVENTION

In the following, one embodiment of an electronic circuit device of an electric power steering apparatus of a vehicle, to which the present invention is applied, will be explained in detail based on the drawings.

Figure 1:
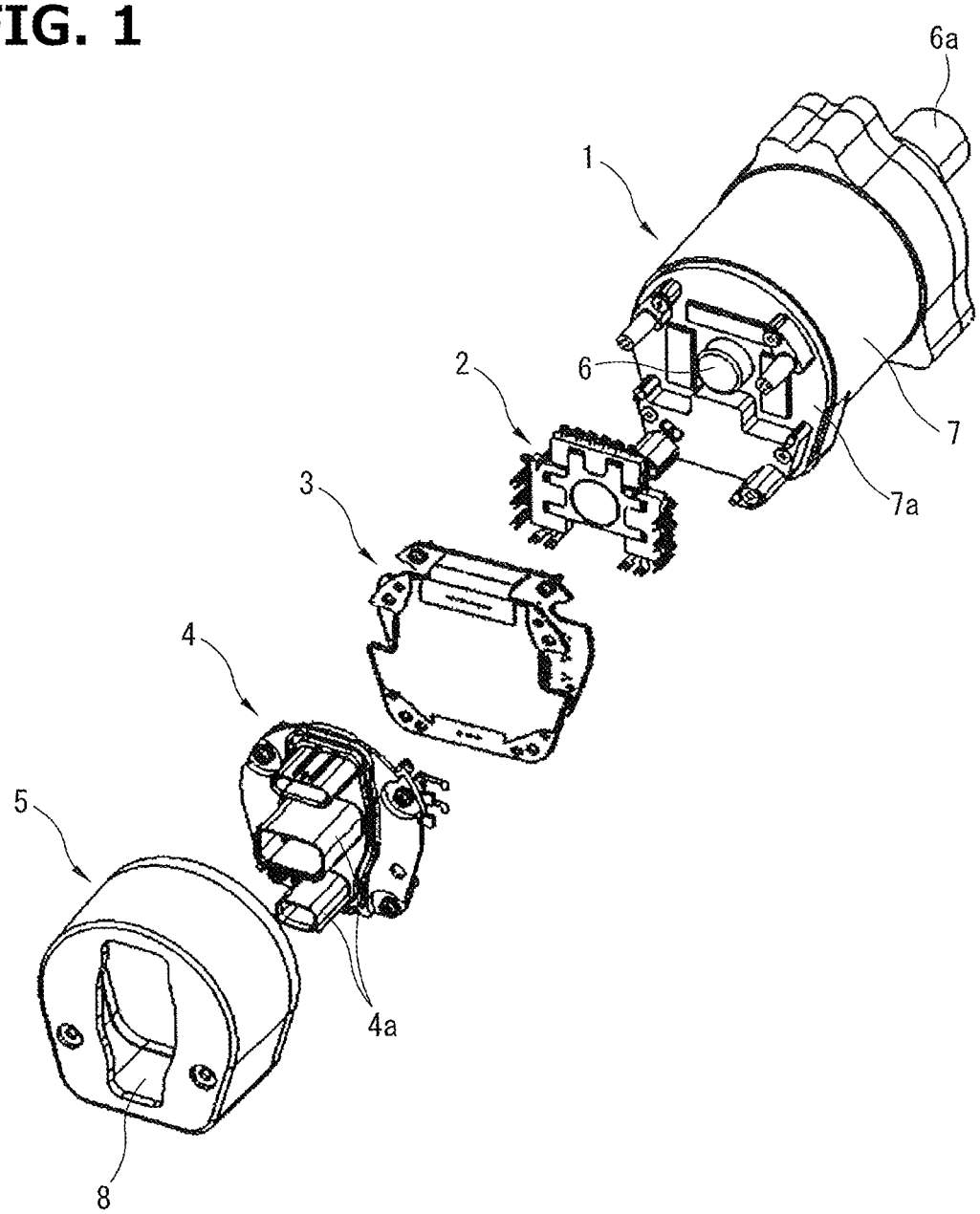
FIG. 1 is a perspective exploded view of an electric actuator for a power steering apparatus into which a circuit board according to the present invention is incorporated.

FIG. 1 is a perspective exploded view of an electric actuator for applying steering auxiliary force to a steering mechanism which is not shown in the drawings, in the electric power steering apparatus. This electric actuator is provided with a cylindrical motor part 1, a power module 2 including a switching element which becomes an inverter, a circuit board 3 which becomes one embodiment of the present invention, a connector member 4 in which a plurality of connectors 4a are integrally collected, and a motor cover 5 attached to one end portion of the motor part 1 so as to cover the power module 2, the circuit board 3 and the connector member 4.

The motor part 1 is one in which a motor (not shown) formed of a stator and a rotor are accommodated in the inside of a cylindrical housing 7. The motor part 1 includes a connecting portion 6a, such as a gear and a spline, at the distal end of a rotation shaft 6 protruding from the distal end surface of the housing 7, so as to be connected to a steering mechanism which is not shown in the drawing via the connecting portion 6a. One end portion of the housing 7 which is an opposite side to the connecting portion 6a is formed as a bottom wall portion 7a having a horseshoe-shaped outline such that a part of the outer peripheral edge thereof radially extends, and the motor cover 5 having a horseshoe-shaped outline corresponding to that of the bottom wall portion 7a is attached thereto so as to cover the bottom wall portion 7a. Then, the power module 2, the circuit board 3 and the connector member 4 are accommodated in the space formed between the bottom wall portion 7a and the motor cover 5 so as to be axially superposed. In addition, a plurality of the connectors 4a of the connector member 4 protrude to the outside through an opening portion 8 of the motor cover 5.

That is, the electric actuator has a configuration in which an electric motor section and an electronic circuit device section required for driving and controlling it are integrated. In other words, the housing 7 of the motor part 1 and the motor cover 5 serve as a case for accommodating the circuit board 3 of the electronic circuit device. In this way, by integrating the electronic circuit device with the motor, the size of the electric actuator is reduced.

Figure 2:
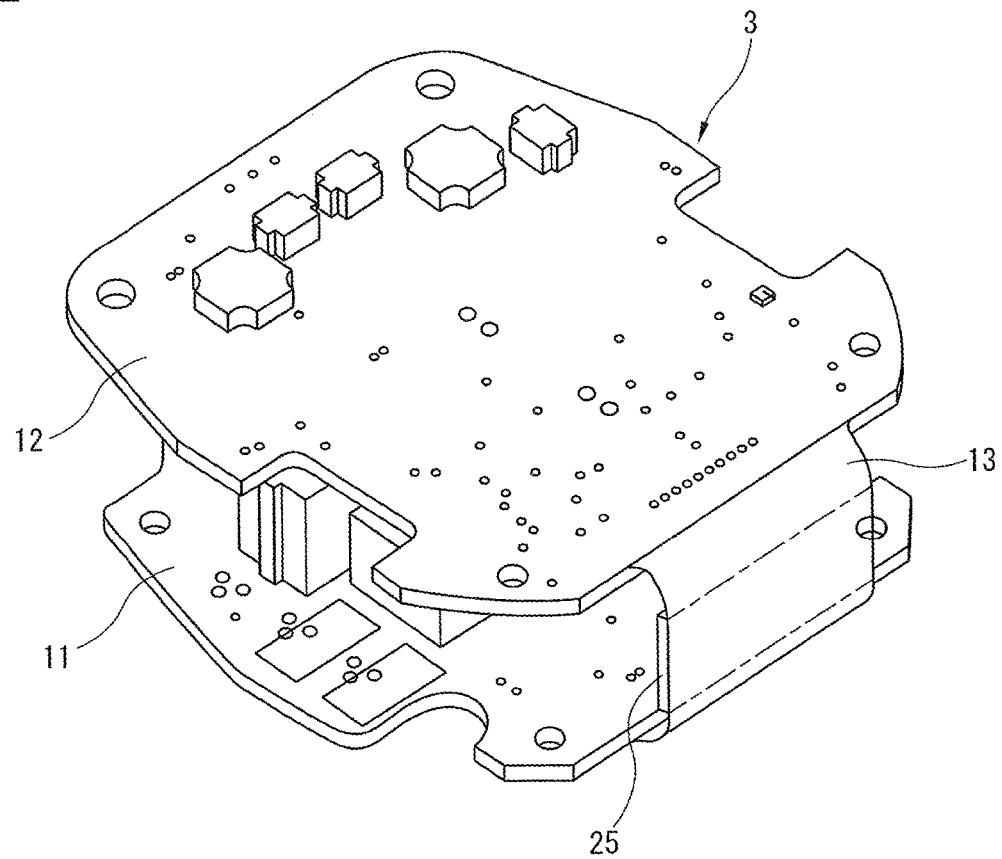
FIG. 2 is a perspective view of the circuit board in a state of being bent.

FIG. 2 is a perspective view schematically showing the circuit board 3. As shown in FIG. 2, the circuit board 3 is incorporated to the electric actuator in a state of being bent in a substantially U-shape. That is, the circuit board 3 is provided with a first rigid part 11 which becomes a board for power system mounting electronic components for power system through which a relatively large current flows for the driving of the motor, a second rigid part 12 which becomes a board for control system mounting electronic components for control system through which a relatively small current flows, and a flexible part 13 disposed between the first rigid part 11 and the second rigid part 12. The first rigid part 11 corresponds to "first component mounting part", and the second rigid part 12 corresponds to "second component mounting part". Then, the circuit board 3 is accommodated between the housing 7 and the motor cover 5 serving as a case in a state in which the flexible part 13 is deformed and bent such that the first rigid part 11 and the second rigid part 12 are superposed to each other in the axial direction of the rotation shaft 6. Specifically, in an embodiment, the first rigid part 11 and the second rigid part 12 are fixed to and supported by the electric actuator in a state of being bent so as to be away from each other by a distance in which the electronic components mounted on the first rigid part 11 do not come in contact with the electronic components mounted on the second part 12, and in a state in which they are parallel to each other while keeping a plane state.

Figure 3:
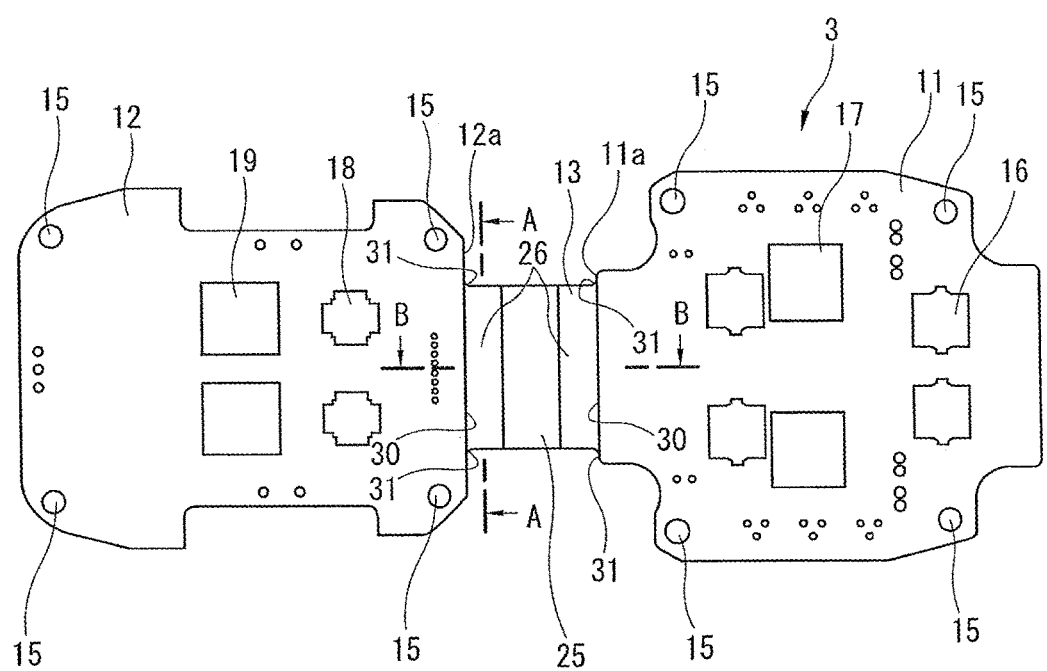
FIG. 3 is a plane view of the circuit board before being bent.
Figure 4:
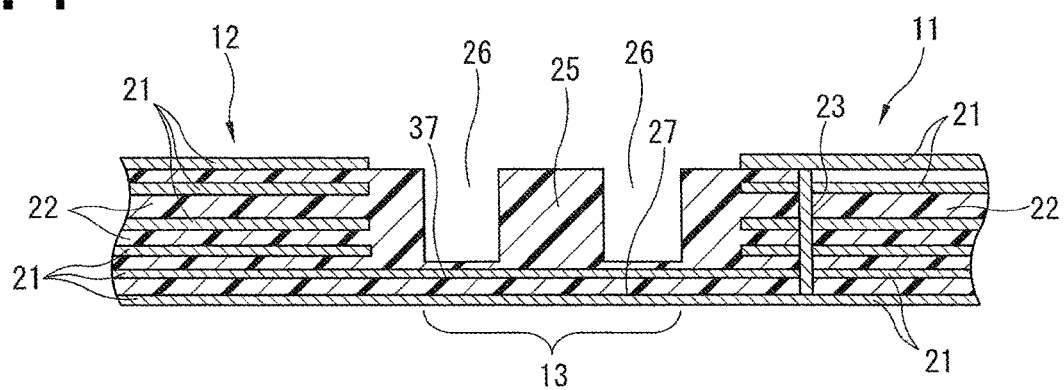
FIG. 4 is a sectional view taken along a line B-B of FIG. 3.
Figure 5:
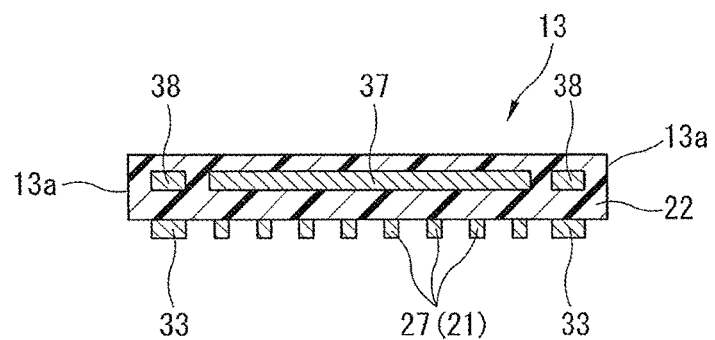
FIG. 5 is a sectional view taken along a line A-A of FIG. 3.

FIG. 3 is a plane view of the circuit board 3 in an expansion state, that is, a state before being bent. FIG. 4 shows a cross-section taken along a line B-B of FIG. 3, and FIG. 5 shows a cross-section taken along a line A-A of FIG. 3. In addition, the sectional view of each of FIG. 4 and FIG. 5 is a so-called illustrative view, and a dimensional relationship of each part is not always accurate. In the expansion state shown in FIG. 3, the circuit board 3 is formed as one circuit board in which the first rigid part 11, the second rigid part 12 and the flexible part 13 are arranged along one plane. In FIG. 3, a surface which becomes inside when being bent as shown in FIG. 2 is shown.

Each of the first rigid part 11 and the second rigid part 12 has a shape similar to a square shape having mounting holes 15 at the respective four corners. The middle part in a side of the first rigid part 11 and the middle part in a side of the second rigid part 12, which are adjacent to each other, are connected to each other by the band-shaped flexible part 13 having a fixed width. That is, as compared with the width (dimension in the direction orthogonal to a bending direction) of each of the first rigid part 11 and the second rigid part 12, the width of the flexible part 13 is narrow. The circuit board 3 therefore has an I-shape or 8-shape as a whole. In this way, the width of each of the first and second rigid parts 11 and 12 is relatively wide and the width of the flexible part 13 is relatively narrow, and thereby a component mounting area can be large, and, in addition, the bending and deformation of the flexible part 13 become easy. Electronic components for power system, such as a capacitor 16 and a coil 17, are surface-mounted on the first rigid part 11. Electronic components for control system, such as an IC 18 for a sensor and a CPU 19, are surface-mounted on the second rigid part 12. In addition, also in the surface on the opposite side to the surface shown in FIG. 3, that is, in the surface which becomes outside in a state of being bent, a plurality of relatively small electronic components which are not shown in the drawings are surface-mounted on the first rigid part 11 and the second rigid part 12.

The circuit board 3 is formed of a multilayer printed wiring board. Specifically, the circuit board 3 is formed of a printed wiring board having a so-called six-layer structure equipped with six metal foil layers 21 (see FIG. 4). This multilayer printed wiring board is formed by laminating base materials 22 of some layers made of, for example, glass epoxy, each of which is equipped with a metal foil layer 21 on one or both surfaces, via prepreg (adhesive layers) and heat-compressing it so as to be integrated. In each of the first rigid part 11 and the second rigid part 12, desired circuit patterns conducted to various electronic components are formed by the etching of the metal foil layer 21 and the forming of a via 23 (see FIG. 4) extending in a lamination direction.

As shown in FIG. 4, as compared with the thickness (dimension in the lamination direction) of the board of the first rigid part 11 and the board of the second rigid part 12 each having a six-layer structure, the flexible part 13 is formed to be relatively thin so as to have flexibility higher than that of each of the first rigid part 11 and the second rigid part 12. In one embodiment, for example, after forming the circuit board 3 having a six-layer structure in a rectangular shape including the first rigid part 11, the second rigid part 12 and the flexible part 13, by secondary machining, four layers of the six layers which become inside when being bent in the flexible part 13 are scraped so as to be made thin. Therefore, the material of the base materials 22 of the first and second rigid parts 11 and 12 is the same as that of base materials 22 of the flexible part 13, and in the two layers remaining as the flexible part 13, the base materials 22 are continuously extend between the first rigid part 11 and the second rigid part 12 via the flexible part 13.

In addition, in an example shown in the drawing, a middle rigid portion 25 having a six-layer structure remains in the middle of the flexible part 13 so as to ensure a printing surface for, for example, a barcode, and thin portions as a pair of recessed grooves 26 are formed on the respect both sides of the middle rigid portion 25. This middle rigid portion 25 is not an essential portion, and the whole of the flexible part 13 may be formed so as to be thin. In the present embodiment, the whole between the first rigid part 11 and the second rigid part 12, including the middle rigid part 25, is referred to as the flexible part 13.

A pair of the recessed grooves 26 giving flexibility required for the flexible part 13 are formed along one side of the first rigid part 11 and one side the second rigid part 12 respectively. With this, borders 30 between the first rigid part 11 and the flexible part 13 and between the second rigid part 12 and the flexible part 13 are defined. In other words, by the edges on the outer sides of the recessed grooves 26 formed to be thin, a pair of the borders 30 are defined, and when being bent as shown in FIG. 2, the thin flexible part 13 is bent and deformed between a pair of the borders 30. The width (dimension in the direction orthogonal to the bending direction) of the circuit board 3 is reduced at the borders 30 at which the first and second rigid parts 11 and 12 are shifted to the flexible part 13. Here, in order to suppress stress concentration at the borders 30 due to the reduction of the width dimension, arc-shaped fillet portions 31 are provided to the shifting portions between the first and second rigid parts 11 and 12 and the flexible part 13 (see FIG. 3). That is, although a side 11a along the border 30 of the first rigid part 11 and a side 12a along the border 30 of the second rigid part 12 intersect outer edges 13a of the flexible part 13 at the angle of 90°, the intersecting portions are each rounded into an arc shape having an appropriate diameter.

Figure 6:
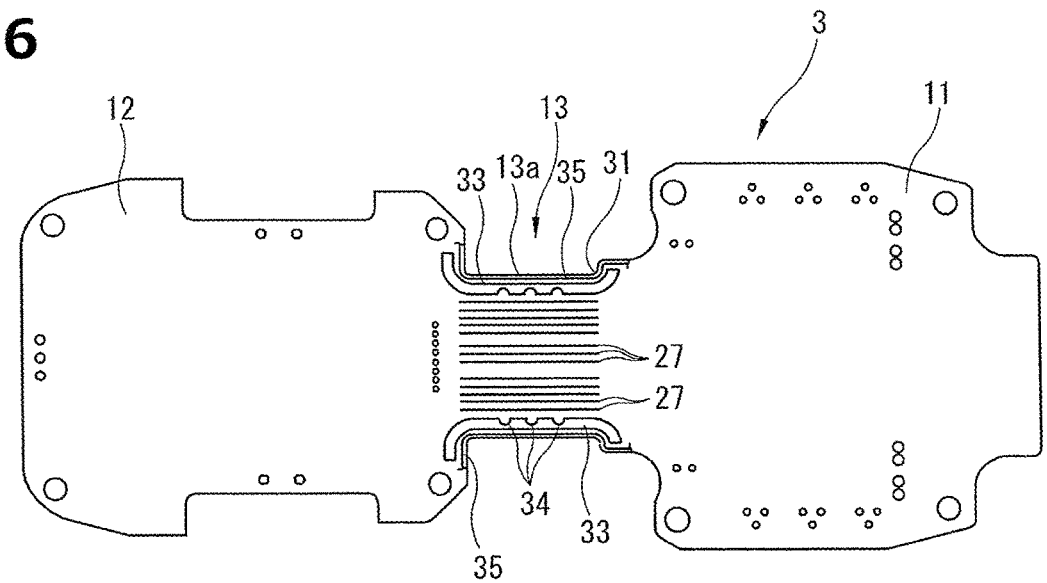
FIG. 6 is a plane view showing metal patterns in a first metal foil layer.
Figure 7:
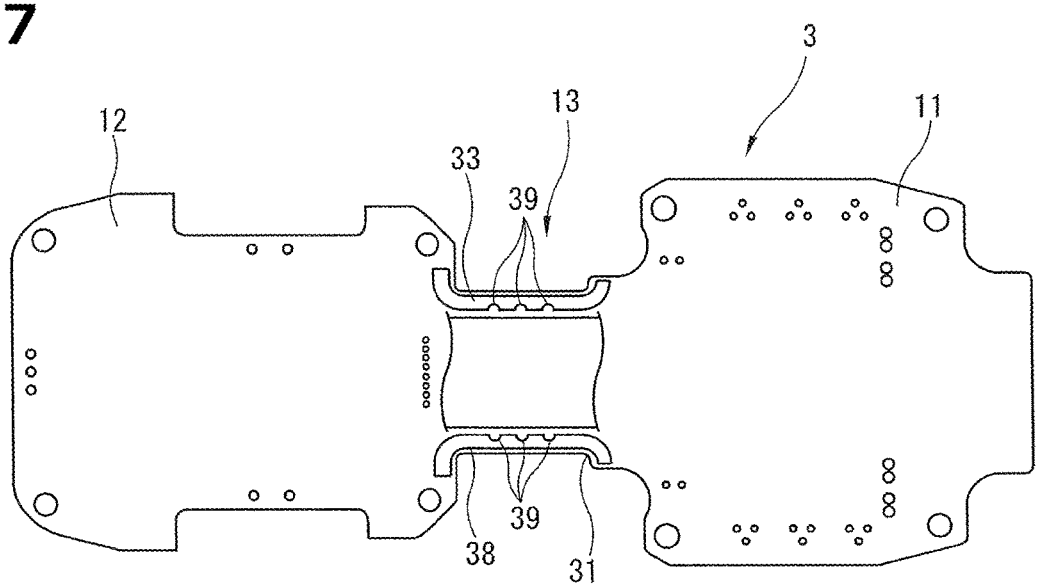
FIG. 7 is a plane view showing metal patterns in a second metal foil layer.

In the flexible part 13 (recessed grooves 26), of the six metal foil layers 21, a first metal foil layer 21 located on the outer side surface when being bent and a second metal foil layer 21 remain. In addition, although the middle rigid part 25 has a thickness corresponding to the thickness of the six layers, metal patterns formed by third to sixth metal foil layers 21 do not exist in the middle rigid part 25. In FIG. 6, metal patterns formed by the etching to the first metal foil layer 21 are shown. In FIG. 7, metal patterns formed by the etching to the second metal foil layer 21 are shown.

As shown in FIG. 6, in the flexible part 13, a plurality of conductive wires 27 electrically connecting between the electronic components of the first rigid part 11 and the electronic components of the second rigid part 12 are formed by using the first metal foil layer 21. A plurality of the conductive wires 27 extend simply linearly and extend parallel to each other between the first rigid part 11 and the second rigid part 12. Each of the conductive wires 27 is also parallel to the side edges of the flexible part 13, that is, parallel to liner outer edges 13a of the flexible part 13. Although the both ends of each of the conductive wires 27 linearly formed in the flexible part 13 are continued to respective circuit patterns formed to the first metal foil layer 21 of the first rigid part 11 and the second rigid part 12, the circuit patterns of the first rigid part 11 and the second rigid pattern 12 are omitted in FIG. 6.

Here, as shown in FIG. 6, non-conductive metal patterns 33 are formed by the first metal foil layer 21 in the respective vicinities of the outer edges 13a of the flexible part 13. The non-conductive metal patterns 33 are so-called dummy patterns independently separated from adjacent conductive wires 27 and the other circuit patterns, and are not conducted to any electronic components. The non-conductive metal patterns 33 are formed along the outer edges 13a of the flexible part 13 so as to be slightly apart from the respective outer edges 13a. In addition, each of the non-conductive metal patterns 33 extends linearly between the first rigid part 11 and the second rigid part 12, and is formed in a belt-like shape having a width wider than that of each of the adjacent conductive wirings 27. Each of the non-conductive metal patterns 33 includes end portions 33a, one of which extends from the flexible part 13 to a part of the side 11a of the first rigid part 11 while intersecting the border 30 between the flexible part 13 and the first rigid part 11, and the other of which extends from the flexible part 13 to a part of the side 12a of the second rigid part 12 while intersecting the border 30 between the flexible part 13 and the second rigid part 12, and each of the both end portions 33a is curved in an arc shape along a corresponding one of the fillet portions 31 of the circuit board 3.

Therefore, as is clear from FIG. 6, each of the non-conductive metal patterns 33 is provided at a position closer to a corresponding one of the outer edges 13a of the flexible part 13 than the conductive wires 27, and a plurality of the conductive wires 27 are disposed on the inner side of a pair of the non-conductive metal patterns 33. Therefore, by the non-conductive wires 33, the conductive wires 27 are protected from the cracks of the base material accompanying the bending or deformation of the flexible part 13. That is, when the circuit board 3 is bent in a substantially U-shape as mentioned above, cracking tends to occur near the borders 30 in the thin flexible part 13 formed of the base materials 22 made of, for example, glass epoxy. However, regarding such occurrence of cracking, in the above embodiment, since the non-conductive metal patterns 33 exist close to the respective outer edges 13a, the cracking itself hardly occurs. In addition, even if the cracking occurs to the outer edges 13a, by the non-conductive patterns 33, the increase of the cracking can be suppressed, and thereby the disconnection of the conductive wires 27 positioned inside is inhibited. Moreover, in the above embodiment, since the fillet portions 31 are provided to the both ends of each of the borders 30, stress concentration along the borders 30 and the occurrence of the cracking are suppressed.

Each of the non-conductive metal patterns 33 is formed with a plurality of arc-shaped notches 34 (for example, three notches) at the side edge on the inner side (side edge on a side adjacent to a conductive wire 27) so as not to spoil flexibility required for the flexible part 13. Consequently, as narrowed width portions, width (dimension in the direction orthogonal to the bending direction) of the non-conductive metal patterns 33 is partially narrowed at the positions corresponding to the notches 34, and the bending and deformation can be easily performed.

The first metal foil layer 21 is the outermost layer which is not covered with a base material 22 of the circuit board 3, and the almost whole of the first metal foil layer 21 is finally covered with resist except a part at which soldering is carried out. In the outer peripheral edge of the circuit board 3, from the viewpoint of machining accuracy, in general, the print formation of this resist is carried out to the position slightly retreated from the outer edge of a board itself. As mentioned above, the non-conductive metal patterns 33 are formed so as to be slightly apart from the outer edges 13a of the flexible part 13, and the outer edges of the resist, each of which is shown by a reference number of "35" in FIG. 6, are located between the outer edges 13a of the flexible part 13 and the non-conductive metal patterns 33. Consequently, the non-conductive patterns 33 are surely covered with the resist, and the corrosion of the non-conductive patterns 33 is suppressed.

In the second metal foil layer 21 shown in FIG. 7, a rectangular ground portion 37 having a wide width is formed in the middle in the width direction of the flexible part 13. This ground portion 37 is connected to a ground wiring of the first rigid part 11 or the second rigid part 12, which is not shown in the drawings, and is finally grounded via an appropriate path. Second non-conductive metal patterns 38 having shapes similar to those of the non-conductive metal patterns 33 in the first metal foil layer 21 are formed at respective positions close to the outer edges 13a of the flexible part 13. Each of the second non-conductive metal patterns 38 is also a dummy pattern independently separated from the ground portion 37 and other circuit patterns, and is not conducted to any electronic components. Although each of the second non-conductive metal patterns 38 is basically formed in a shape overlapping a corresponding one of the non-conductive metal patterns 33 in the first metal foil layer 21 in the lamination direction, different from the outermost non-conductive metal patterns 33, the second non-conductive metal patterns 38 are covered with the lamination of the base material 22, and are formed to respective positions corresponding to the positions of the resist outer edges 35 in the first metal foil layer 21, that is, positions close to the outer edges 13a. In an example shown in the drawing, the width of the second non-conductive metal patterns 38 is therefore wider than that of the non-conductive metal patterns 33 in the first metal foil layer 21. As narrowed width portions, in order to partially narrow the width of the second non-conductive metal patterns 38, three arc-shaped notches 39 are also formed to each of the second non-conductive metal patterns 38. These notches 39 are located at positions corresponding to the notches 34 of the non-conductive metal patterns 33 in the first metal foil layer 21.

In this way, in the above embodiment, the second metal foil layer 21 is further provided with the second non-conductive metal patterns 38, and consequently, the strength of the outer edges 13a of the flexible part 13 becomes higher. Moreover, the occurrence of cracks and the disconnection of the conductive wires 27 due to the cracks are further surely suppressed.

Figure 8:
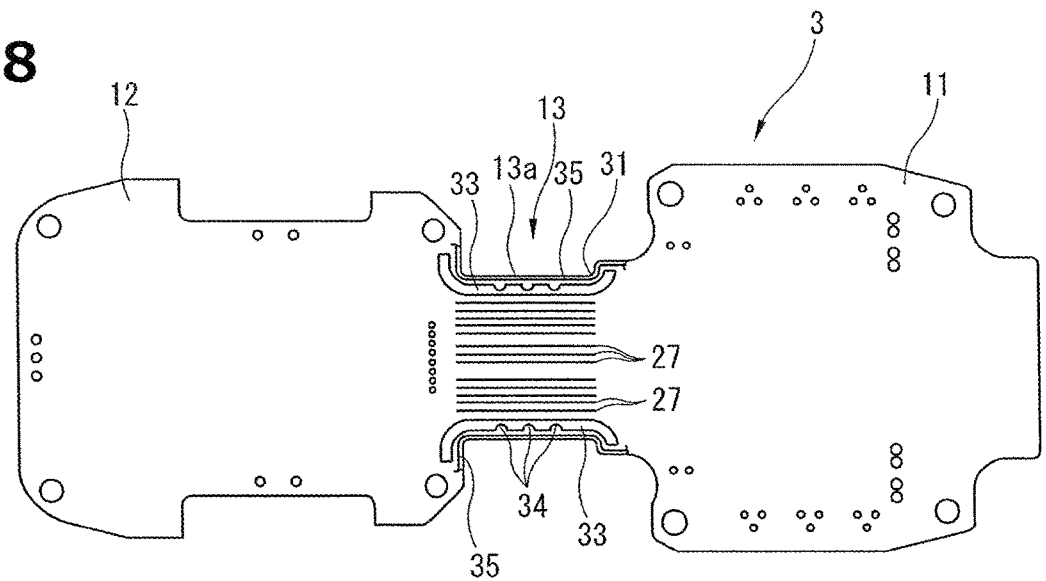
FIG. 8 is a plane view showing metal patterns in a first metal foil layer of a second embodiment.
Figure 9:
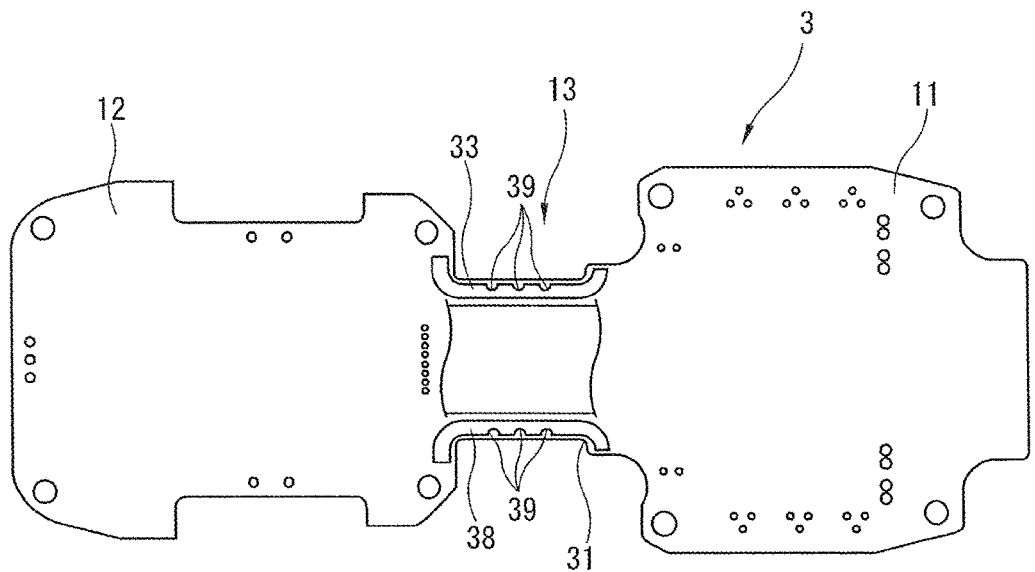
FIG. 9 is a plane view showing metal patterns in a second metal foil layer of the second embodiment.

FIG. 8 and FIG. 9 show a second embodiment in which the formation position of each of the notches 34 and 39 is changed. In FIG. 8, similar to FIG. 6 mentioned above, metal patterns formed on the first metal foil layer 21 are shown, and in FIG. 9, similar to FIG. 7 mentioned above, metal patterns formed on the second metal foil layers 21 are shown. As shown in FIG. 8 and FIG. 9, a plurality of arc-shaped notches 34 (for example, three notches) are formed to each of the side edges (side edges adjacent to the outer edges 13*a* of the flexible part 13) on the outer side of the non-conductive metal patterns 33, and a plurality of arc-shaped notches 39 (for example, three notches) are formed to each of the side edges (side edges adjacent to the outer edges 13*a* of the flexible part 13) on the outer side of the second non-conductive metal patterns 38. Consequently, as narrowed width portions, width of each of the non-conductive metal patterns 33 and the second non-conductive metal patterns 38 is partially narrowed, and the bending and deformation can be easily performed.

Figure 10:
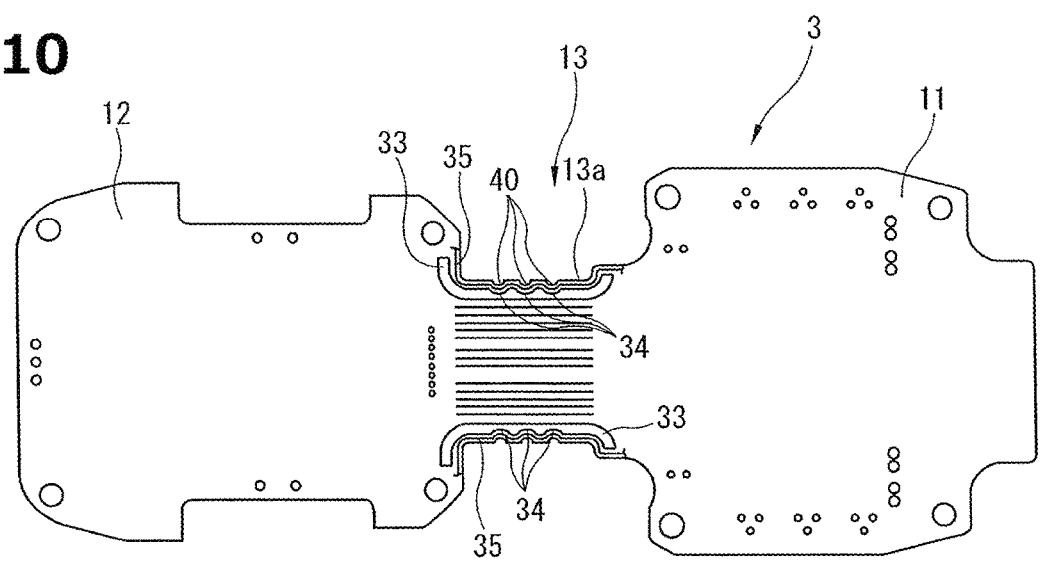
FIG. 10 is a plane view showing metal patterns in a first metal foil layer of a third embodiment.
Figure 11:
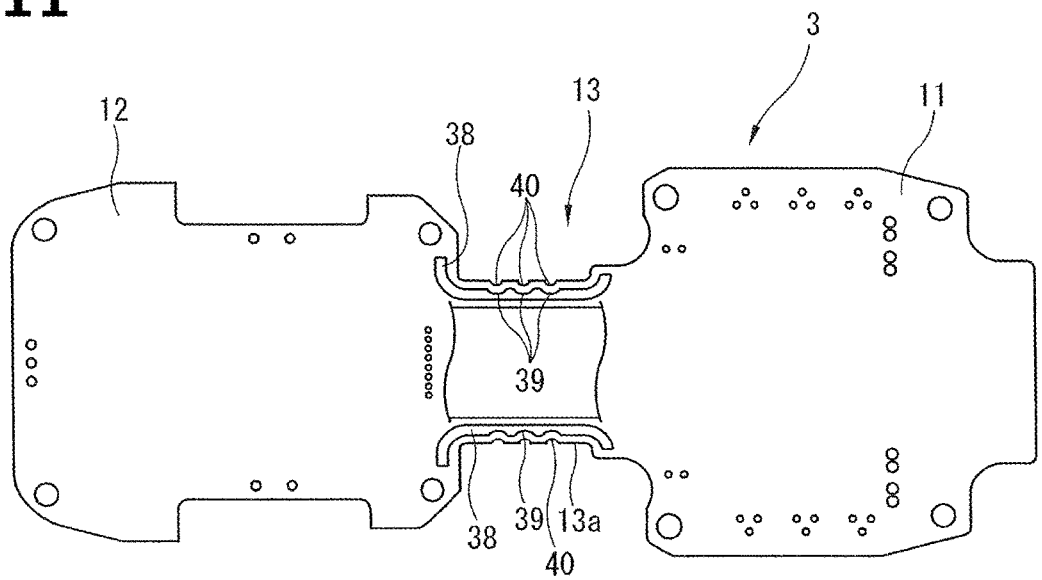
FIG. 11 is a plane view showing metal patterns in a second metal foil layer of the third embodiment.

FIG. 10 and FIG. 11 show a third embodiment in which the configuration around each of the notches 34 and 39 is changed. In FIG. 10, similar to FIG. 6 and FIG. 8 mentioned above, metal patterns formed on the first metal foil layer 21 are shown, and in FIG. 11, similar to FIG. 7 and FIG. 9 mentioned above, metal patterns formed on the second metal foil layer 21 are shown. As shown in FIG. 10 and FIG. 11, in the third embodiment, similar to the second embodiment, a plurality of arc-shaped notches 34 (for example, three notches) are formed to each of the side edges (side edges adjacent to the outer edges 13*a* of the flexible part 13) on the outer side of the non-conductive metal patterns 33, and a plurality of arc-shaped notches 39 (for example, three notches) are formed to each of the side edges (side edges adjacent to the outer edges 13*a* of the flexible part 13) on the outer side of the second non-conductive metal patterns 38. Moreover, in the third embodiment, arc-shaped notches 40 are formed to each of the outer edges 13*a* of the flexible part 13 so as to correspond to the respective notches 34 and arc-shaped notches 40 are formed to each of the outer edges 13*a* of the flexible part 13 so as to correspond to the respective notches 39. That is, the notches 40 are formed to the base material 22 in the outer edges 13*a* of the flexible part 13, and the notches 34 of the non-conductive metal patterns 33 and the notches 39 of the second non-conductive metal patterns 38 are provided so as to surround the notches 40. In addition, as mentioned above, the first non-conductive metal patterns 33 are covered with resist, and outer edges of the resist, each of which is shown by a reference number of "35", are located between the notches 40 of the base material and the notches 34 of the non-conductive metal patterns 33.

In this way, according to the third embodiment in which the notches 40 are also disposed to the base material 22 in the flexible part 13, the flexible part 13 is bent further easily. Therefore, the occurrence of cracks at the borders 30 can be suppressed.

As the above, although one embodiment of the present invention has been explained in detail, the present invention is not limited to the above embodiments, and various modification can be possible. For example, in the above embodiments, although the flexible part 13 is formed in a belt-like shape having a fixed width, even in a case where the flexible part is not formed in such a simple shape, the present invention can be also applied. Each of the conductive wires 27, the non-conductive metal patterns 33 and 38 is not limited to one having a linear shape, but may be a bent shape or a curved shape. In addition, in the above embodiments, although the flexible part 13 is formed by removing four layers of six layers in the circuit board having a six-layer structure, the present invention is not limited to such a producing method.

Moreover; in the above embodiment, although, in two layers, the non-conductive metal patterns 33 and 38 are provided, only one of them may be provided. In a case where non-conductive metal patterns are provided to one layer, when, similar to the non-conductive metal patterns 33, they are located at the same layer as a layer on which the conductive metal patterns 27 are formed, it is advantageous to suppress the disconnection of the conductive metal wires 27 due to the increase in cracking. In the above embodiments, since the non-conductive patterns 33 and 38 are superposed in two layers, it is more advantageous.

In addition, the present invention is not limited to the circuit board of the electric actuator for the power steering apparatus, and it can be applied to an electronic circuit device for various use. The present invention can be also applied to a circuit board having a configuration in which three or more electronic component mounting parts are provided and the spaces between them are connected by thin flexible parts.

As the above, an electronic circuit board of the present invention is an electronic circuit board on which electronic components are mounted, and includes:

at least two component mounting parts mounted with the electronic components; a flexible part located between the two component mounting parts adjacent to each other, formed to have a thickness thinner than that of each of boards of the component mounting parts so as to have flexibility higher than that of each of the component mounting parts, and provided with a conductive wire electrically connecting between the two component mounting parts; and a non-conductive metal pattern provided at a position closer to an outer edge of the flexible part than the non-conductive wire, in the flexible part.

In a preferable aspect, the non-conductive metal pattern extends so as to intersect borders between the component mounting parts and the flexible part.

In another preferable aspect, the non-conductive metal pattern is provided to each of both sides of the flexible part, and a plurality of conductive wires are provided between the two non-conductive metal patterns.

In another preferable aspect, the non-conductive metal pattern is formed along the outer edge of the flexible part so as to be slightly apart from the outer edge.

In another preferable aspect, the non-conductive metal pattern has one or a plurality of narrowed width portions, in each of which width along a direction orthogonal to a bending direction of the flexible part is partially narrowed.

For example, the non-conductive metal pattern has, at at least one side edge thereof, a plurality of notches, and by the notches, the narrowed width portions are formed.

In another embodiment, the non-conductive metal pattern has the notches at one side edge thereof which becomes an outer edge side of the flexible part, and notches are formed to the outer edge of the flexible part so as to be along the notches of the non-conductive metal pattern.

In addition, an electronic circuit device of the present invention is an electronic circuit device for driving and controlling an actuator, and includes: a case; and an electronic circuit board accommodated in the case. The electronic circuit board includes: a first component mounting part on which an electronic component for power system is mounted and a second component mounting part on which an electronic component for control system is mounted; a flexible part located between the two component mounting parts, formed to have a thickness thinner than that of each of boards of the component mounting parts so as to have flexibility higher than that of each of the component mounting parts, and provided with a conductive wire electrically connecting between the two component mounting parts; and a non-conductive metal pattern provided at a position closer to an outer edge of the flexible part than the conductive wire, in the flexible part, and the electronic circuit board is accommodated in the case in a state in which the flexible part is bent and deformed such that the first component mounting part and the second component mounting part are superposed to each other.

The invention claimed is:

1. An electronic circuit board having a multilayer printed wiring board on which electronic components are mounted, comprising: at least two component mounting parts mounted with the electronic components; a flexible part located between the two component mounting parts adjacent to each other, formed to have a thickness thinner than that of each of boards of the component mounting parts so as to have flexibility higher than that of each of the component mounting parts, and provided with a conductive wire electrically connecting between the two component mounting parts; and a dummy pattern provided at a position closer to an outer edge of the flexible part than the conductive wire, in the flexible part, wherein the dummy pattern extends to each wiring layer of a plurality of wiring layers of the component mounting parts, the plurality of wiring layers extending through and being the same as those of the flexible part so the dummy pattern intersects borders in a plan view between the component mounting parts and the flexible part, wherein the multilayer printed wiring board making up the component mounting parts and the flexible part is formed by laminating layers of base materials, each of which is provided with a metal foil layer on one or both surfaces of a corresponding one layer of the layers of the base materials, wherein the flexible part has a pair of recessed grooves formed by removing at least one wiring layer of the plurality of wiring layers on an outermost side in the flexible part, and wherein the base materials of the component mounting parts and the flexible part extend continuously.

2. The electronic circuit board according to claim 1, wherein the dummy pattern includes two dummy patterns respectively provided to each of both sides of the flexible part, and
wherein a plurality of conductive wires are provided between the two dummy patterns.

3. The electronic circuit board according to claim 1, wherein the dummy pattern is formed along the outer edge of the flexible part so as to be spaced apart from the outer edge.

4. The electronic circuit board according to claim 1, wherein the dummy pattern has one or a plurality of narrowed width portions, in each of which width along a direction orthogonal to a bending direction of the flexible part is partially narrowed.

5. The electronic circuit board according to claim 4, wherein the dummy pattern has, at least one side edge thereof, a plurality of notches forming the narrowed width portions.

6. The electronic circuit board according to claim 5, wherein the dummy pattern has the notches at one side edge thereof which becomes an outer edge side of the flexible part, and
wherein notches are formed to the outer edge of the flexible part so as to be along the notches of the dummy pattern.

7. An electronic circuit device for driving and controlling an actuator, comprising:

a case; and an electronic circuit board accommodated in the case, and having a multilayer printed wiring board, wherein the electronic circuit board includes:

a first component mounting part on which an electronic component for power system is mounted and a second component mounting part on which an electronic component for control system is mounted;

a flexible part located between the two component mounting parts, formed to have a thickness thinner than that of each of boards of the component mounting parts so as to have flexibility higher than that of each of the component mounting parts, and provided with a conductive wire electrically connecting between the two component mounting parts; and a dummy pattern provided at a position closer to an outer edge of the flexible part than the conductive wire, in the flexible part, wherein the electronic circuit board is accommodated in the case in a state in which the flexible part is bent and deformed such that the first component mounting part and the second component mounting part are superposed to each other, wherein the dummy pattern extends to each wiring layer of a plurality of wiring layers of the component mounting parts, the plurality of wiring layers extending through and being the same as those of the flexible part so as to the dummy pattern intersects borders in a plan view between the component mounting parts and the flexible part, wherein the multilayer printed wiring board making up the component mounting parts and the flexible part is formed by laminating layers of base materials each of which is provided with a metal foil layer on one or both surfaces of a corresponding one layer of the layers of the base materials, wherein the flexible part has a pair of recessed grooves formed by removing at least one wiring layer of the plurality of wiring layers on an outermost side in the flexible part, and wherein the base materials of the component mounting parts and the flexible part extend continuously.

\* \* \* \* \*